US012749664B2

(12) United States Patent
Voronin et al.

(10) Patent No.: US 12,749,664 B2
(45) Date of Patent: Sep. 29, 2026

(54) ADVANCED OES CHARACTERIZATION

(71) Applicant: Tokyo Electron Limited, Tokyo (JP)

(72) Inventors: Sergey Voronin, Albany, NY (US); Francisco Machuca, Fremont, CA (US); Blaze Messer, Albany, NY (US); Yan Chen, Fremont, CA (US); Ying Zhu, Fremont, CA (US); Mihail Mihaylov, Fremont, CA (US); Joel Ng, Fremont, CA (US); Ashawaraya Shalini, Fremont, CA (US); Da Song, Albany, NY (US); Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 531 days.

(21) Appl. No.: 18/298,259

(22) Filed: Apr. 10, 2023

(65) Prior Publication Data

US 2024/0339309 A1 Oct. 10, 2024

(51) Int. Cl.
*H01J 37/32* (2006.01)

(52) U.S. Cl.
CPC .. *H01J 37/32972* (2013.01); *H01J 37/32357* (2013.01); *H01J 37/32834* (2013.01); *H01J 37/32963* (2013.01); *H01J 2237/3343* (2013.01)

(58) Field of Classification Search
None
See application file for complete search history.

(56) References Cited

U.S. PATENT DOCUMENTS

| | | | | |
|---|---|---|---|---|
| 5,728,253 | A * | 3/1998 | Saito | H01J 37/32963 118/712 |
| 5,770,922 | A | 6/1998 | Gerrish et al. | |
| 5,879,574 | A | 3/1999 | Sivaramakrishnan et al. | |
| 5,986,747 | A | 11/1999 | Moran | |
| 6,534,007 | B1 | 3/2003 | Blonigan et al. | |
| 6,881,276 | B2 | 4/2005 | Blonigan et al. | |
| 10,871,396 | B2 | 12/2020 | Kim et al. | |
| 2003/0027428 | A1 | 2/2003 | Ng et al. | |
| 2004/0235299 | A1* | 11/2004 | Srivastava | G03F 7/427 438/689 |

(Continued)

FOREIGN PATENT DOCUMENTS

| | | | |
|---|---|---|---|
| KR | 101273922 | B1 | 6/2013 |
| WO | 2018052698 | A1 | 3/2018 |

OTHER PUBLICATIONS

International Search Report and Written Opinion, PCT Application No. PCT/US2024/014964, mailed May 28, 2024, 9 pages.

*Primary Examiner* — Ram N Kackar
*Assistant Examiner* — Laureen Chan
(74) *Attorney, Agent, or Firm* — Slater Matsil, LLP

(57) ABSTRACT

A processing system that includes: a processing chamber configured to hold a substrate to be processed; a first vacuum pump; a second vacuum pump disposed downstream from the first vacuum pump; an exhaust gas line connecting the process chamber and the first vacuum pump, and the first vacuum pump and the second vacuum pump; a plasma power supply including a first RF power source configured to generate a plasma from a portion of an exhaust gas between the first and second vacuum pumps; and an optical emission spectroscopy (OES) measurement assembly including an OES detector configured to measure OES signals from the plasma.

20 Claims, 10 Drawing Sheets

(56) References Cited

U.S. PATENT DOCUMENTS

| | | | | |
|---|---|---|---|---|
| 2005/0221617 | A1* | 10/2005 | Rueger | H01J 37/32357 216/61 |
| 2006/0207630 | A1 | 9/2006 | Sakai et al. | |
| 2007/0064227 | A1* | 3/2007 | Powell | G01N 21/73 356/316 |
| 2009/0180113 | A1* | 7/2009 | Monkowski | G01N 21/68 216/60 |
| 2010/0055807 | A1 | 3/2010 | Srivastava et al. | |
| 2010/0224322 | A1* | 9/2010 | Sui | H01J 37/32963 156/345.25 |
| 2015/0325410 | A1 | 11/2015 | Godet et al. | |
| 2016/0111261 | A1* | 4/2016 | Kabouzi | H01J 37/32532 438/10 |
| 2016/0126068 | A1 | 5/2016 | Lee et al. | |
| 2022/0172928 | A1 | 6/2022 | Ro et al. | |
| 2025/0006476 | A1* | 1/2025 | Nagao | H01J 49/00 |

* cited by examiner

ADVANCED OES CHARACTERIZATION

TECHNICAL FIELD

The present invention relates generally to systems and methods of characterization, and, in particular embodiments, to advanced optical emission spectroscopy (OES) characterization.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate.

Advanced process control that involves process and system characterization and fault detection in semiconductor manufacturing is essential for reproducible production of complex structures. Especially in high-volume manufacturing, plasma system diagnosis is of paramount importance for process consistency. As the minimum dimension of features in a patterned layer has shrunk periodically and new materials have been introduced in ICs, the need for improved plasma system diagnosis to assure process compliance and cost reduction has increased.

SUMMARY

In accordance with an embodiment of the present invention, a processing system that includes: a processing chamber configured to hold a substrate to be processed; a first vacuum pump; a second vacuum pump disposed downstream from the first vacuum pump; an exhaust gas line connecting the process chamber and the first vacuum pump, and the first vacuum pump and the second vacuum pump; a plasma power supply including a first RF power source configured to generate a plasma from a portion of an exhaust gas between the first and second vacuum pumps; and an optical emission spectroscopy (OES) measurement assembly including an OES detector configured to measure OES signals from the plasma.

In accordance with an embodiment of the present invention, a plasma processing system that includes: a plasma processing chamber configured to hold a substrate to be processed; a RF power source configured to generate a first plasma in the plasma processing chamber; a first vacuum pump; an exhaust gas line connecting the plasma process chamber and the first vacuum pump; a plasma power supply configured to generate a second plasma from a portion of an exhaust gas downstream from the plasma processing chamber, and an optical emission spectroscopy (OES) measurement assembly including: an OES detector configured to measure first OES signals from the first plasma and second OES signals from the second plasma; a microprocessor, and a non-transitory memory storing a program to be executed in the microprocessor, the program including instructions to: perform a plasma process on a substrate; during the process, record the first or second OES signals associated with a chemical composition of the first or second plasma, and based on the first or second OES signals, estimate a temporal change of the chemical composition to evaluate a progress of the process.

In accordance with an embodiment of the present invention, a method of processing a substrate that includes: plasma processing a substrate in a plasma processing chamber by exposing the substrate to a first plasma; using a vacuum system, remove an exhaust gas from the plasma processing chamber to an exhaust gas line; using an optical emission spectroscopy (OES) measurement assembly connected to the plasma processing chamber, detecting first OES signals from the first plasma during the plasma processing, the first OES signals being associated with a chemical composition of the first plasma; generating a second plasma from the exhaust gas downstream from the plasma processing chamber; using the OES measurement assembly, detecting second OES signals from the second plasma during the plasma processing, the second OES signals being associated with a chemical composition of the second plasma; and based on the first or second OES signals, estimating a temporal change of the chemical composition of the first or second plasma.

BRIEF DESCRIPTION OF THE DRAWINGS

For a more complete understanding of the present invention, and the advantages thereof, reference is now made to the following descriptions taken in conjunction with the accompanying drawings, in which:

FIGS. 11A-11B illustrate experimental data of example OES EPD, wherein FIG. 11A illustrates time evolution of exhaust and chamber OES signals from an organic removal process, and FIG. 11B illustrates time evolution exhaust and chamber OES signals from the organic removal process at another process condition.

DETAILED DESCRIPTION OF ILLUSTRATIVE EMBODIMENTS

Figure 1:
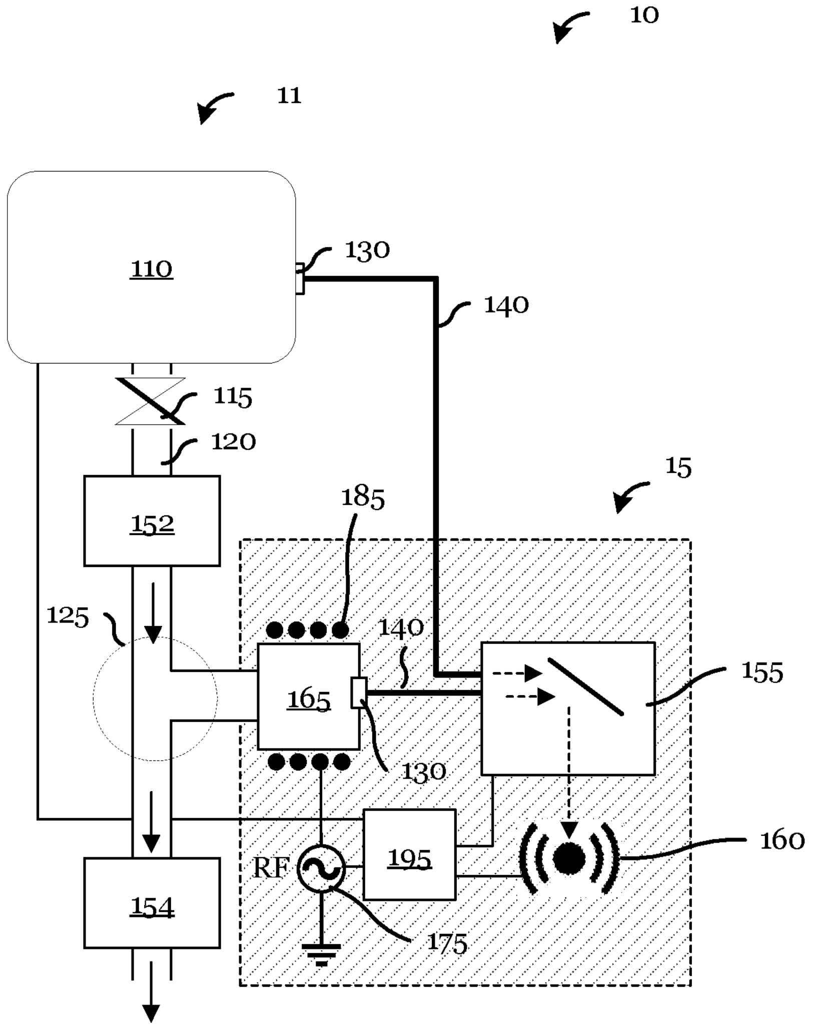
FIG. 1 illustrates an example dual optical emission spectroscopy (OES) system coupled with a processing system and configured to measure exhaust OES signals in accordance with an embodiment.

This application relates to systems and methods of process characterization, more particularly to optical emission spectroscopy (OES) for advanced process characterization. In semiconductor manufacturing, plasma processing is used at various stages for depositing and etching various materials to construct complex structures with precision at nanometer scale. Because a plasma is a highly energetic and complex system comprising ion and radical species, it is often challenging to accurately characterize the plasma during operation and monitor the progress of a plasma process. Optical emission spectroscopy (OES) is a powerful spectroscopic tool to analyze atoms and ions present in a plasma by detecting optical emission from excited species, and OES systems have been incorporated to some plasma processing systems. For example, using OES to collect light emission signal from process plasmas, endpoint detection (EPD) of a plasma etch process such as reactive ion etching (RIE) and atomic layer etching (ALE) may be achieved.

However, depending on the types of materials being processed and the process parameters, a change of an optical emission spectrum of plasma during the process may be subtle and relatively difficult to detect. Further, some process conditions require very mild or even zero plasma discharge, leading to limited sensitivity of existing OES methods due to insufficient excitation for optical emissions. New OES methods with improved sensitivity are therefore desired for advanced process characterization, especially in pulsed plasma, low-powered plasma, or plasma-less processes.

Embodiments of the present application disclose improved systems and methods of OES data collection during a semiconductor processing, in which an additional plasma source may be introduced for additional OES data collection. The additional plasma source may be used to generate an additional plasma external to a processing chamber, particularly in an exhaust system downstream from the processing chamber. OES data from the exhaust system (exhaust OES) may be collected in addition to OES data from the processing chamber (chamber OES), enabling "dual" OES data collection. The exhaust OES, alone or in combination with the chamber OES, may be used for various types of process characterization such as process monitoring and endpoint detection (EPD). The use of exhaust OES may improve the sensitivity of OES system during a process. This is particularly beneficial for processes where the chamber OES signal from the processing chamber is unstable, weak or absent, such as pulsed plasma, low-powered plasma, or plasma-less processes.

In the following, various examples for dual optical emission spectroscopy (OES) for measuring exhaust OES signals coupled with a processing system are described referring to FIGS. 1-4. An optional electrical probe of the dual OES is then described referring to FIG. 5. In FIG. 6, an example plasma processing system in accordance with an embodiment is described. Example process flow diagrams and power pulsing for the methods of OES data collection, process monitoring, and endpoint detection (EPD) are illustrated in FIGS. 7-10. Example experimental OES data are then illustrated in FIGS. 11A-11B to demonstrate the utility of the exhaust OES in accordance with one embodiment. All figures in this disclosure are drawn for illustration purpose only and not to scale.

FIG. 1 illustrates an example dual optical emission spectroscopy (OES) system 10 coupled with a processing system and configured to measure exhaust OES signals in accordance with an embodiment.

In FIG. 1, the dual OES system 10 may comprise a processing system 11 and an OES measurement assembly 15. In various embodiments, the processing system 11 may be configured to process a substrate, for example, as a part of semiconductor device fabrication. The dual OES system 10 may accordingly be configured to perform process characterization of the process performed by the processing system 11. The systems of dual OES may be applied to any appropriate processing system. In various embodiments, the processing system 11 is a plasma processing system, but various types and configurations for the processing system 11 including a non-plasma (e.g., thermal) processing system are possible. For illustration purpose, various elements of the processing system 11 that may be present (e.g., gas inlets, plasma power supply, electrodes, substrate holder, transfer ports, etc.) are omitted in FIG. 1. As illustrated in FIG. 1, the processing system 11 may comprise a processing chamber 110 connected to an exhaust gas line 120. A throttle valve 115 may be used as a part of a vacuum system to control the pressure of the processing chamber 110. Although only one throttle valve is illustrated at an upstream portion of the exhaust gas line 120 is illustrated in FIG. 1, more throttle valves may be used at any reasonable position of the vacuum system. The processing chamber 110 may further comprise an optical port 130 where an optical fiber cable 140 is attached to collect and transmit OES signals, if any, from the processing chamber 110 to an optical switch 155.

A vacuum system for the processing system 11 may comprise a first vacuum pump 152 and a second vacuum pump 154, both connected to the processing chamber 110 via the exhaust gas line 120 such that the second vacuum pump is disposed downstream from the first vacuum pump 152. In various embodiments, the first vacuum pump 152 may be a turbomolecular pump. In certain embodiments, the pressure in the portion of the exhaust gas line 120 between the two pumps may be between 1 mTorr and 10 Torr.

As illustrated in FIG. 1, the OES measurement assembly 15 may comprise an exhaust OES chamber 165 that is connected to the exhaust gas line 120 via a tee conduit 125 disposed between the first vacuum pump 152 and the second vacuum pump 154. Although the positioning of the exhaust OES chamber 165 may not be limited to any particular location, placing the exhaust OES chamber 165 at this particular portion of the exhaust gas line 120 downstream from the processing chamber 110 (i.e., between the first vacuum pump 152 and the second vacuum pump 154) may be mechanically more feasible compared to other locations due to limited space. In various embodiments, a plasma may be generated from the exhaust gas (exhaust plasma) in the exhaust OES chamber 165 and its OES signals may be measured by an OES detector 160. Although not illustrated in FIG. 1, the exhaust OES chamber 165 may further be connected to any elements that may be useful for sustaining the exhaust plasma (e.g., throttle valve, additional gas inlet, and additional gas outlet).

In one or more embodiments, the exhaust OES chamber 165 may be equipped with a temperature controller (e.g., heating/cooling system). In one embodiment, the temperature in the exhaust gas line 120 and/or the exhaust OES chamber 165 may be kept relatively high to prevent residual by-product accumulation on the surfaces.

Disposing the exhaust OES chamber 165 between the first vacuum pump 152 and the second vacuum pump 154 may advantageously benefit the practicality for generating the exhaust plasma in several aspects. First, the pressure may be maintained low as suitable for a gas discharge for the exhaust plasma. Excitation of the exhaust gas further downstream from the processing chamber 110, for example, after the second vacuum pump, would be more difficult and impractical due to higher pressure environment. Second, the proximity of the exhaust OES chamber 165 to the processing chamber 110 may minimize the delay of OES signals responsive to an event (e.g., endpoint or process failure) in the processing chamber 110.

A radio frequency (RF) power source 175 may be used as a power supply for generating the exhaust plasma, and RF electrodes 185 may be disposed outside the walls of the exhaust OES chamber 165. Although not specifically illustrated, any RF power source (e.g., the RF power source 175) may comprise a power generator and a matching network.

The RF electrode 185 may be a conductive helix coiled horizontally around the walls comprising a dielectric (e.g., a ceramic material). The RF electrode 185 may alternatively be shaped like a planar coil. The RF electrode 185 is coupled to the RF power source 175. In various embodiments, the oscillation frequency of the RF power may be about 400 kHz to about 5 GHz and, in certain embodiment about 15 MHz to about 200 MHz. In one embodiment, the frequency of the RF power may be between 20 MHz to 40 MHz, for example 27 MHz. When a resonator helical coil is used for the RF electrode 185, the frequency may be selected in consideration of the coil length such that the coil may sufficiently surround the walls of the exhaust OES chamber 165. The RF electrode 185 may be configured to operate in a purely inductively or capacitively coupled mode to sustain the exhaust plasma with an RF power density of about 0.01 $W/cm^3$ to about 30 $W/cm^3$ within the exhaust OES chamber 165. In one embodiment, the RF power source may be operated in pulsing mode with a peak power up to about 30 $W/cm^3$.

The exhaust OES chamber 165 may comprise an optical port 130 where an optical fiber cable 140 is attached to collect and transmit exhaust OES signals from the exhaust OES chamber 165 to the optical switch 155. In various embodiments, the OES measurement assembly 15 may further comprise an OES detector 160 and a control unit 195. Although not specifically illustrated, the control unit 195 may comprise various electrical components required to perform detection, recording, analysis of the OES signals as well as feedback control of the processing system 11 and the OES measurement assembly. Such components may include a transceiver, an amplifier, an analog-to-digital convertor (ADC), a filter, a memory, and a processor. In various embodiments, the OES measurement assembly 15 may be configured to perform a series of operations according to a command from the control unit 195: operating the optical switch 155 to selectively transmit the chamber or exhaust OES signals to the OES detector 160, OES data acquisition at the OES detector 160, receiving the OES data at the transceiver, filtering the OES data at the filter, and determining a characteristic of the plasma (e.g., the exhaust plasma) at the processor. The characteristic of the plasma may, for example, be plasma density, and/or concentrations of reactive ion species, etch by-product, or other species of interest. The characteristic of the plasma may also include information on electron temperature. In certain embodiments, the OES measurement assembly 15 may be further configured to process the obtained raw OES data by, for example, averaging and/or smoothing prior to determining the characteristic of the plasma.

In acquiring the OES data, the OES detector 160 may include, for example, a spectrometer that samples an optical emission spectrum of a plasma. The spectrum, in this example, may include light intensity as a function of wavelength or frequency. The OES detector 160 may comprise a charge-coupled device (CCD) sensor, a complementary metal oxide semiconductor (CMOS) image sensor, or other type of light detection device or photosensor may be utilized to measure the light intensity at a plasma processing chamber of the plasma processing system 11. In certain embodiments, the sensor may comprise a CCD sensor with a capability of millisecond time resolution. In another embodiment, the sensor may comprise a CMOS image sensor with a capability of microsecond time resolution.

In various embodiments, the optical switch 155 is used to selectively transmit one of the two OES signals: the OES signals from the processing chamber 110 (chamber OES) or the OES signals from the exhaust OES chamber 165 (exhaust OES). Using the optical switch 155, it is possible to use the same OES detector for detecting OES signals from two difference sources. Accordingly, the use of a switching mechanism (e.g., the optical switch 155) can enable the dual OES measurements without duplicating the OES detector that would require a substantial additional manufacturing cost. In certain embodiments, the switching may be realized by using a fiber optic splitter in place of the optical switch. In addition to selecting one of the two OES sources, the optic fiber splitter may have an option to superpose the OES signals from both sources, which may advantageously simplify the process of OES data collection. In these embodiments, it may still be possible to perform the deconvolution of the raw data (e.g., mathematical subtraction) to recover information on each of the OES signals. In certain embodiments, the plasma for one of the two OES sources may be powered in a pulsing mode such that the deconvolution may be enabled. In alternate embodiments, the OES detector 160 may comprise a multi-channel detector capable of simultaneously measuring multiple OES data series from different sources. In such embodiments, the optical switch 155 or the like may be omitted from the OES measurement assembly 15.

In various embodiments, the memory of the control unit 195 may comprise a non-transitory computer-readable storage media for storing instructions which are executed by the processor to perform the various functions described herein. For example, the memory may generally include both volatile memory and non-volatile memory (e.g., RAM, ROM, or the like). The memory may be referred to as memory or computer-readable storage media herein. The memory is capable of storing computer-readable, processor-executable program instructions as computer program code that may be executed by the processor(s) as a particular machine configured for carrying out the operations and functions described in the implementations herein.

The OES measurement assembly 15 is capable of collecting a plurality of wavelengths of optical emission spectra emanating from the glow discharge of gases in a plasma. These wavelengths can be associated with the specific chemical species generated from entering reactant gases, can result from gas phase reactions as well as reactions on the wafer and chamber surfaces. The OES measurement assembly 15 may be configured to detect various chemical species relevant in semiconductor fabrication processes, including but not limited to, for example, halides of silicon and the halogen species itself (e.g. Cl, F, and Br). In one or more embodiments, the methods OES may be used to monitor a plasma etch process. For example, the plasma etch process may comprise etching of silicon oxide using a fluorine-containing chemistry, such as a fluorocarbon or hydrofluorocarbon gas. In such embodiments, it is useful to dynamically detect halides of silicon and the halogen species (F) that are released by the decomposition of the fluorocarbon or hydrofluorocarbon gas in order to monitor the plasma etch process for its process and stability. Other detectable byproducts may include carbon monoxide (CO), and carbon dioxide ($CO_2$), formed by reaction of oxygen (O) from a film or gas mixture with carbon (C) from the fluorocarbon or hydrofluorocarbon gas.

The wavelengths of the optical emission spectra can also shift as the surface composition of the wafer is changed by the removal of etched layer. In addition to the change in surface composition of the wafer, operating conditions (e.g., gas flow rates, pressure, and power pulsing conditions) can also lead to a shift in the optical emissions spectra. A temporal analysis based on the detection of these shifts may provide useful information about the characteristic of the plasma and thereby the progress of the plasma process.

In various embodiments, the configuration of the OES measurement assembly 15 may be particularly arranged for the type of plasma discharge typically used in the processing system 11. For example, a range of species and wavelengths for detection may be different for high-density ICP, low-density CCP, electron cyclotron resonance (ECR) plasma, and others.

Although the description of this disclosure is focused on dual OES embodiments with two OES sources (i.e., chamber and exhaust OES), the systems and methods may be applicable to single or more than two OES source(s). For example, in one embodiment, the OES measurement assembly may be solely configured to detect the exhaust OES signals and the optical fiber cable 140 from the processing chamber 110 in FIG. 1 may be omitted. In other embodiments, a third OES source (e.g., collecting two exhaust OES signals from two different regions of the exhaust system) may be introduced.

Figure 2:
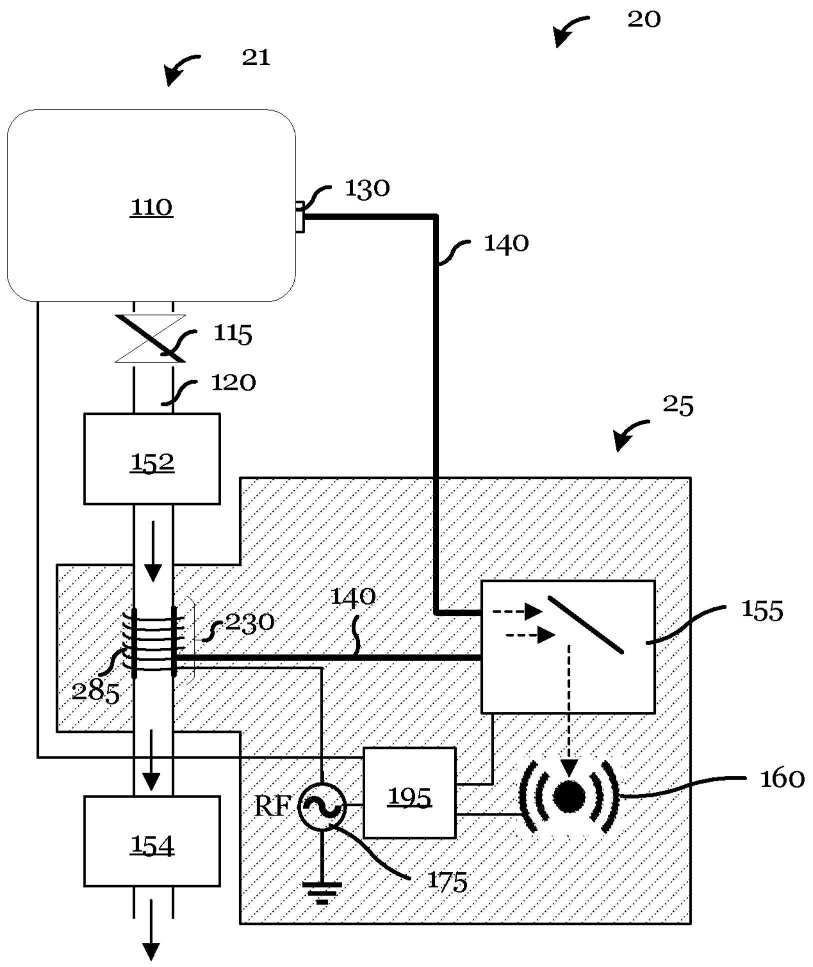
FIG. 2 illustrates another example dual OES system coupled with a processing system and comprising an in-line power coupler in accordance with an embodiment.

FIG. 2 illustrates another example dual OES system 20 coupled with a processing system 21 and comprising an in-line power coupler 230 in accordance with an embodiment. In FIG. 2, various elements of the dual OES system 20, the processing system 21, an OES measurement assembly 25, may be identical to those in FIG. 1, and therefore the details of those elements will not be repeated.

In FIG. 2, the exhaust OES chamber with the tee conduit of the prior embodiments is omitted and replaced with an in-line power coupler 230 to generate a plasma within an exhaust gas line 120, at an in-line OES area, instead of a separate chamber. The in-line power coupler 230 may be positioned at the in-line OES area of the exhaust gas line 120 between a first vacuum pump 152 and a second vacuum pump 154. The in-line power coupler 230 may comprise a RF coil 285, a conductive helix coiled vertically around the in-line OES area of the exhaust gas line 120.

In various embodiments, the in-line OES area or a larger area of the exhaust gas line 120 may be fabricated from an optically transparent material (e.g., quartz or sapphire) such that the exhaust OES signals may be directly collected by an optical fiber cable 140 without any optical port. In other embodiments, where the in-line OES area is not optically transparent, an optical port may be formed (not illustrated). In one or more embodiments, the exhaust gas line 120 may be about 0.5 m to 2.0 m long, and the in-line OES area may be about 1 cm to 30 cm long.

In FIGS. 1 and 2, the exhaust plasma may be inductively coupled, but it may be ignited and sustained differently in other embodiments. For example, the exhaust plasma may be capacitively coupled using two electrodes disposed within an exhaust OES chamber. In alternate embodiments, microwave plasma (MW) or other suitable systems may also be used.

Figure 3:
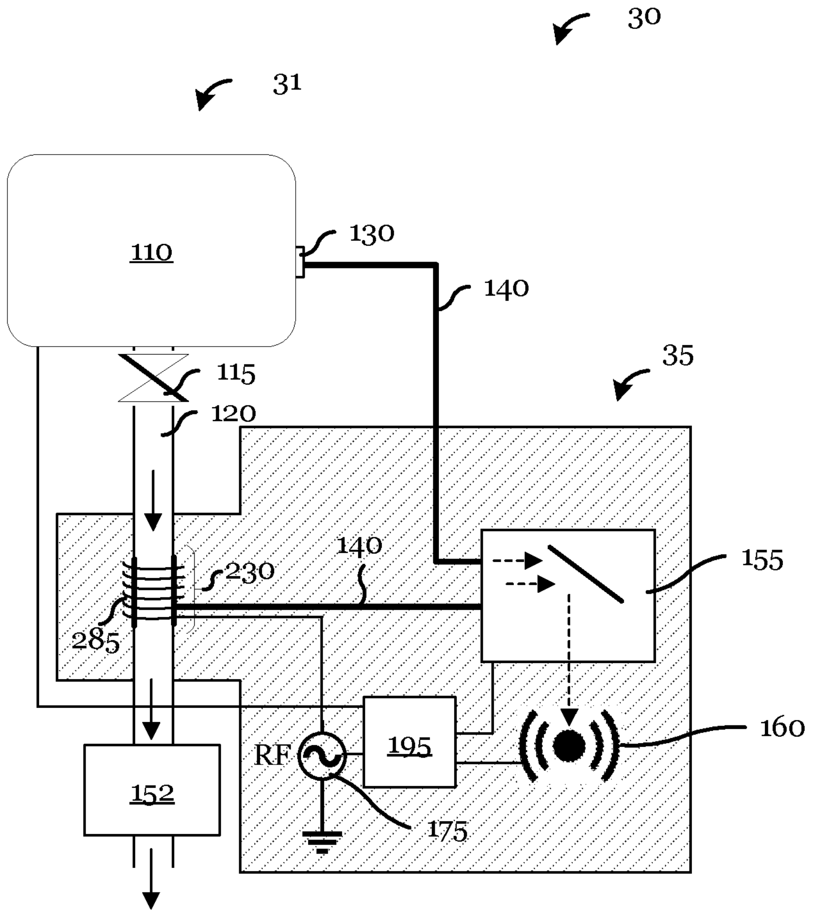
FIG. 3 illustrates yet another example dual OES system coupled with a processing system in accordance with yet another embodiment.

FIG. 3 illustrates yet another example dual OES system 30 coupled with a processing system 31 in accordance with yet another embodiment. In FIG. 3, various elements of the dual OES system 30, the processing system 31, an OES measurement assembly 35, may be identical to those in FIG. 2, and therefore the details of those elements will not be repeated.

In FIG. 3, unlike the prior embodiments, an in-line OES area of an exhaust gas line 120 for generating an exhaust plasma for OES data collection is upstream from a first vacuum pump 152. In various embodiments, as illustrated in FIG. 3, the in-line OES area may be between a throttle valve 115 and the first vacuum pump 152, but in other embodiments, it may be upstream from the throttle valve 115.

Although the OES measurement assembly 35 is illustrated with an in-line power coupler 230, identical to those in FIG. 2, any other appropriate type and configuration of plasma and power coupling may be used, for example, using a tee conduit and an exhaust OES chamber as illustrated in FIG. 1.

Figure 4:
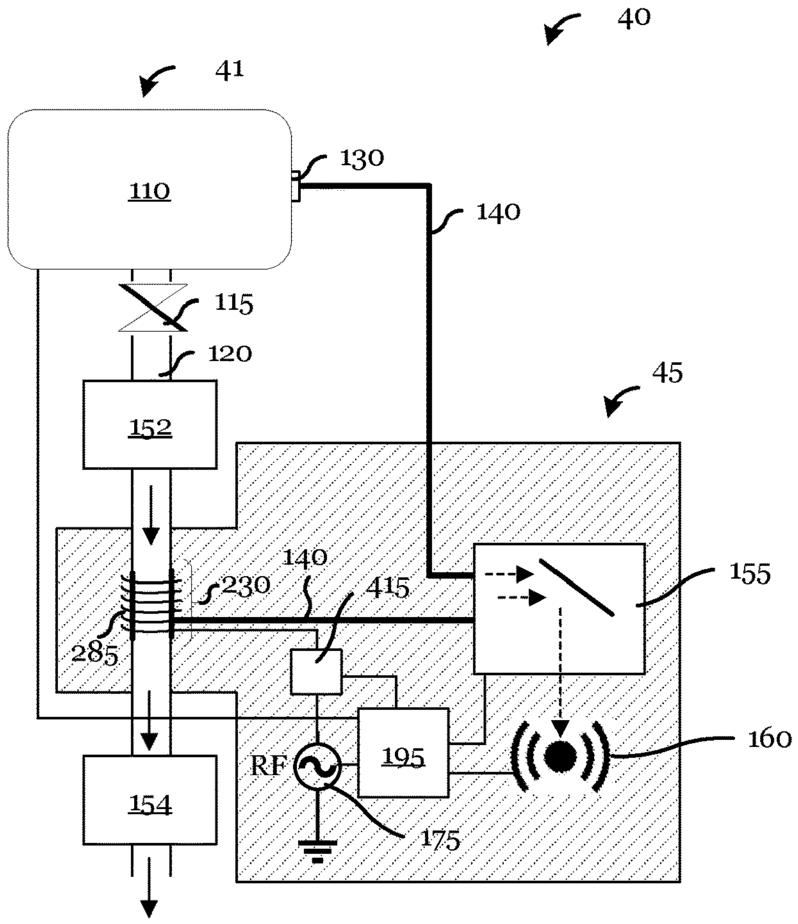
FIG. 4 illustrates an alternate example dual OES system coupled with a processing system and an exhaust electrical probing system in accordance with an embodiment.

FIG. 4 illustrates an alternate example dual OES system 40 coupled with a processing system 41 and an exhaust electrical probing system 415 in accordance with an embodiment. In FIG. 4, various elements of the dual OES system 40, the processing system 41, an OES measurement assembly 45, may be identical to those in FIG. 2, and therefore the details of those elements will not be repeated.

Figure 5:
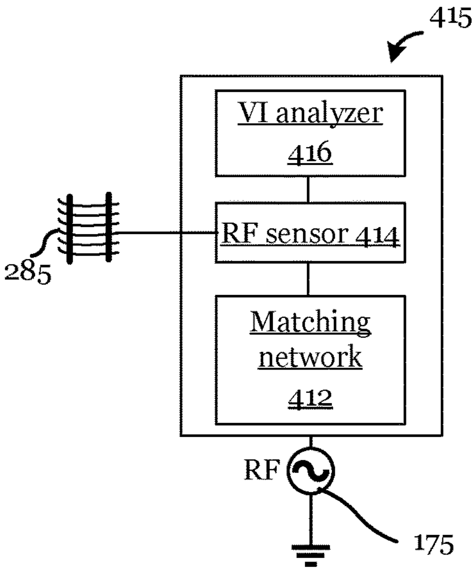
FIG. 5 illustrates an example exhaust electrical probing system of a dual OES system in accordance with an embodiment.
Figure 6:
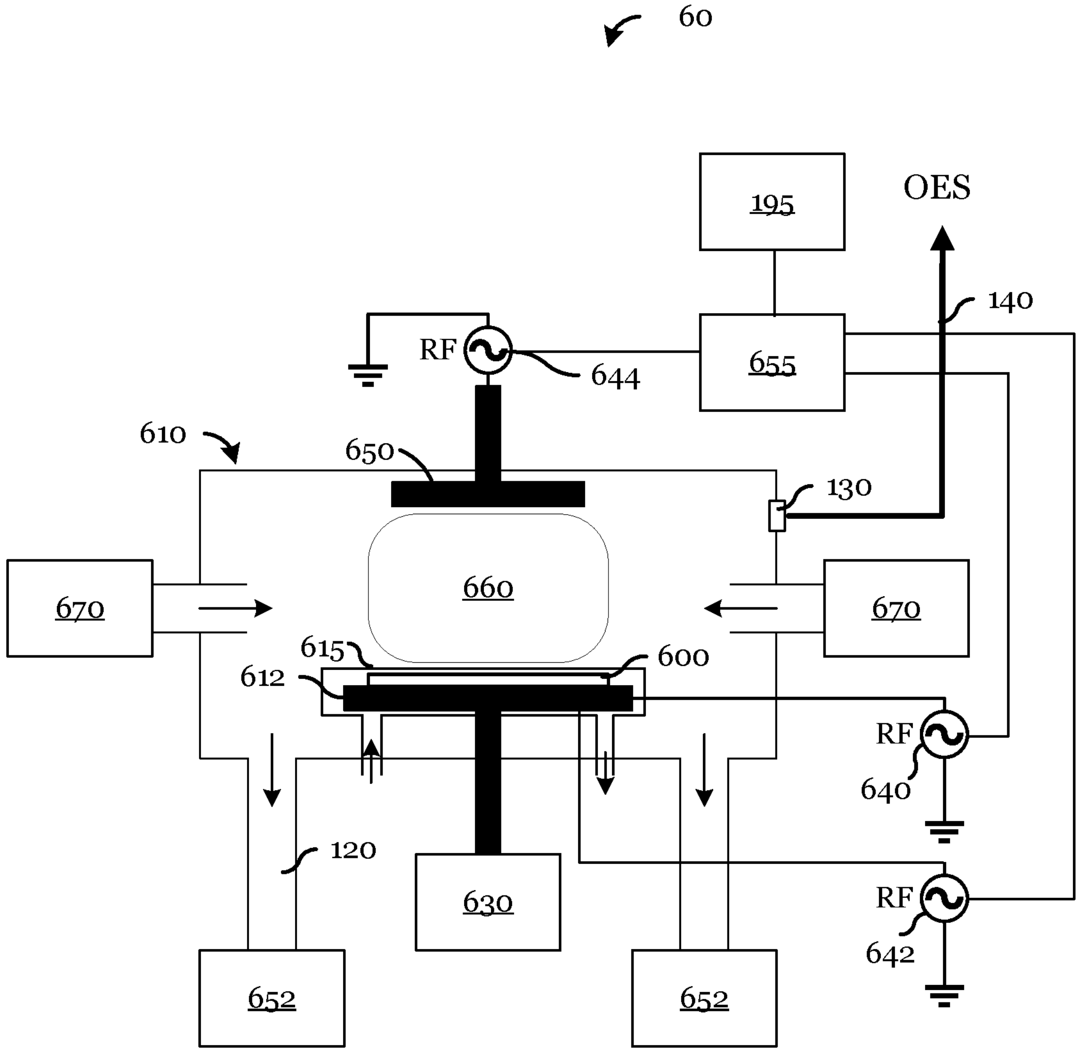
FIG. 6 illustrates an example plasma processing system in accordance with various embodiments.

FIG. 5 illustrates an example exhaust electrical probing system 415 of a dual OES system in accordance with an embodiment. Referring to FIG. 5, the example exhaust electrical probing system 415 includes a matching network 412, RF sensor 414, and a VI analyzer 416.

In various embodiments, as illustrated in FIG. 4, the exhaust electrical probing system 415 may be added to an OES measurement assembly for improving exhaust OES-based process characterization by providing electrostatic probe data. In FIG. 4, the exhaust electrical probing system 415 may be connected to a RF power source 175, a control unit 195, and a RF coil 285, and may be configured to measure electrostatic parameters of the exhaust plasma generated in the in-line OES area of an exhaust gas line 120. In various embodiments, electrostatic parameters such as voltage (V), current (I), and phase angle (φ) may be monitored during processing a substrate using the processing system 41. These monitored electrostatic parameters can provide additional information of the exhaust plasma, and thereby the progress of the process. Accordingly, a combination of the electrostatic probe data and OES data may improve the robustness of process characterization such as endpoint detection (EPD). For example, in case of methods of OES-based EPD, various embodiments may comprise steps to estimate two endpoints separately based on the electrostatic probe data and OES data, respectively, and then compare the two to evaluate the reliability of the estimation. Further, one of the two data types can serve as a fail-safe for the other, advantageously reducing the risk of analysis failure. As a result, the methods may reliably distinguish and detect a wafer or detection tool failure.

FIG. 6 illustrates an example plasma processing system 60 in accordance with various embodiments. For illustration purpose, an OES measurement assembly connected to the plasma processing system 60 as well as some elements of plasma processing system 60 (e.g., a second vacuum pump) are omitted in FIG. 6 since it is already described referring to FIGS. 1-4.

In various embodiments, the systems and methods of OES advanced process characterization may be used to monitor a plasma process using a plasma processing system. For illustrative purposes, FIG. 6 illustrates a substrate 600 placed on a substrate holder 612 (e.g., a circular electrostatic chuck (ESC)) inside a plasma processing chamber 610 near the bottom. The substrate 600 may be optionally maintained at a desired temperature using a heater/cooler 615 that surrounds the substrate holder 612. The temperature of the substrate 600 may be maintained by a temperature controller 630 connected to the substrate holder 612 and the heater/cooler 615. The ESC may be coated with a conductive material (e.g., a carbon-based or metal-nitride based coating) so that electrical connections may be made to the substrate holder 612.

Process gases may be introduced into the plasma processing chamber 610 by a gas delivery system 670. The gas delivery system 670 comprises multiple gas flow controllers to control the flow of multiple gases into the chamber. Each of the gas flow controllers of the gas delivery system 670 may be assigned for each of fluorocarbons, noble gases, and/or balancing agents. In some embodiments, optional center/edge splitters may be used to independently adjust the gas flow rates at the center and edge of the substrate 600. The process gases or any exhaust gases may be evacuated from the plasma processing chamber 610 using vacuum pumps 652. An exhaust gas line 120 connects the plasma processing chamber 610 and the vacuum pumps 652, and extend further downstream, where the OES measurement assembly may be connected for exhaust OES data collection (not shown in FIG. 6).

As illustrated in FIG. 6, the substrate holder 612 may be a bottom electrode of the plasma processing chamber 610. In the illustrative example in FIG. 6, the substrate holder 612 is connected to two RF power sources, 640 and 642. In some embodiment, a conductive circular plate inside the plasma processing chamber 610 near the top is the top electrode 650. In FIG. 6, the top electrode 650 is connected to another RF power source 644 of the plasma processing system 60. In various embodiments, all of power sources for plasma processing (e.g., RF power sources 640, 642, and 644) are connected to a chamber control unit 655 to enable a synchronized operation of the power sources. Further, the chamber control unit 655 may also be connected to a control unit 195 of an OES measurement assembly. In certain embodiments, the chamber control unit 655 and the control unit 195 of the OES measurement assembly may be integrated as a single unit. At an appropriate position of a wall of the plasma processing chamber 610, an optical port 130 may be disposed, and an optical fiber cable 140 may receive and transmit the optical emission from the processing region of a plasma 660 between the substrate 600 and the top electrode 650 to the OES measurement assembly.

In various embodiments, the chamber control unit 655 is configured to enable feedback control of a plasma process, for example, based on a process monitoring using the OES methods. The chamber control unit 655 may comprise a function generator including an appropriate digital and/or analog circuitry such as oscillators, pulse generators, modulators, combiners, and the like. The function generator is capable of generating one or more arbitrary waveforms that may be used for both power modulation of the RF power sources and OES data acquisition. In certain embodiments, some of the power modulation may be performed by the RF power sources themselves instead of the function generator. In such cases, the function generator may generate a pulse train synchronized with the power modulation by the RF power sources for OES data acquisition. In certain embodiments, although not illustrated, additional components (e.g., a broadband amplifier and a broadband impedance matching network) may be connected to the RF power sources.

In certain embodiments, power sources may comprise a DC power source. The RF and/or DC power sources (e.g., the RF power sources 640, 642, and 644) may be configured to generate a continuous wave (CW) RF, pulsed RF, DC, pulsed DC, a high frequency rectangular (e.g., square wave) or triangular (e.g., sawtooth) pulse train, or a combination or superposition of more than one such waveform. In addition, power sources may be configured to generate a periodic function, for example, a sinusoid whose characteristics such as amplitude and frequency may be adjusted during a plasma process.

A typical frequency for the RF source power can range from about 0.1 MHz to about 6 GHz. In certain embodiments, the RF power sources 642 and 644 may be used to provide a low frequency RF power and a high frequency RF power at the same time, respectively.

In certain embodiments, the plasma etch process may be carried out using a pulsed plasma. The pulsed plasma in this disclosure refers to any type of plasma where a source power, a bias power, or both is pulsed at any frequency. In various embodiments, a pulsing at a frequency between 0.1 kHz and 100 kHz may be used to modulate the plasma source power or the bias power. In certain embodiments, a RF pulsing at a kHz range may be used to power the plasma. In various embodiments, any duty ratio (e.g., 0.1% to 99.9%) may be used for any plasma tool. In certain embodiments, a moderate duty ratio between 10% to 70% or 10% to 80% may be used for capacitively coupled plasma (CCP), and 3% to 90% for inductively coupled plasma (ICP). In one embodiment, a sinusoidal RF signal of 1 MHz may be modulated with an on-off frequency of 100 Hz. In another embodiment, a DC signal may be modulated with an on-off frequency of 100 Hz. In yet another embodiment, a square DC pulse signal of 1 MHz may be modulated with an on-off frequency of 100 Hz. In an alternate embodiment, cyclic modulation of RF or fast DC pulse waveform may be performed at a lower frequency (e.g., <100 Hz) using an algorithm.

The configuration of the plasma processing system 60 illustrated in FIG. 6 is only for example. Various other configurations may be used for a plasma processing system. In various embodiments, the plasma processing system 60 may be a capacitively coupled plasma (CCP) system as illustrated in FIG. 6, or alternately an inductively coupled plasma (ICP) plasma system. In alternate embodiments, the plasma processing system 60 may comprise a resonator such as a helical resonator. Further, microwave plasma (MW) or other suitable systems may also be used. In various embodiments, the RF power, chamber pressure, substrate temperature, gas flow rates and other plasma process parameters may be selected in accordance with the respective process recipe.

Further, the systems and methods of OES are based on the use of exhaust OES and thus it is possible to operate with a weak chamber plasma or even in the absence of a chamber plasma. Conventionally, it may be difficult to obtain sufficient OES signals for process monitoring for weak or pulsed plasma processes. Due to the stringent process requirement, it may often be impossible to change the plasma condition for the purpose of ideal OES data collection. Various embodiments of OES methods with exhaust OES may overcome this issue because the exhaust plasma may be powered independently from the chamber plasma. In other words, a high discharge power may be used for the exhaust plasma to obtain strong exhaust OES signals. In addition, the OES systems and methods may also applied to a non-plasma (e.g., thermal) processing system such as chemical vapor deposition (CVD) or atomic layer deposition (ALD) chamber.

Figure 7:
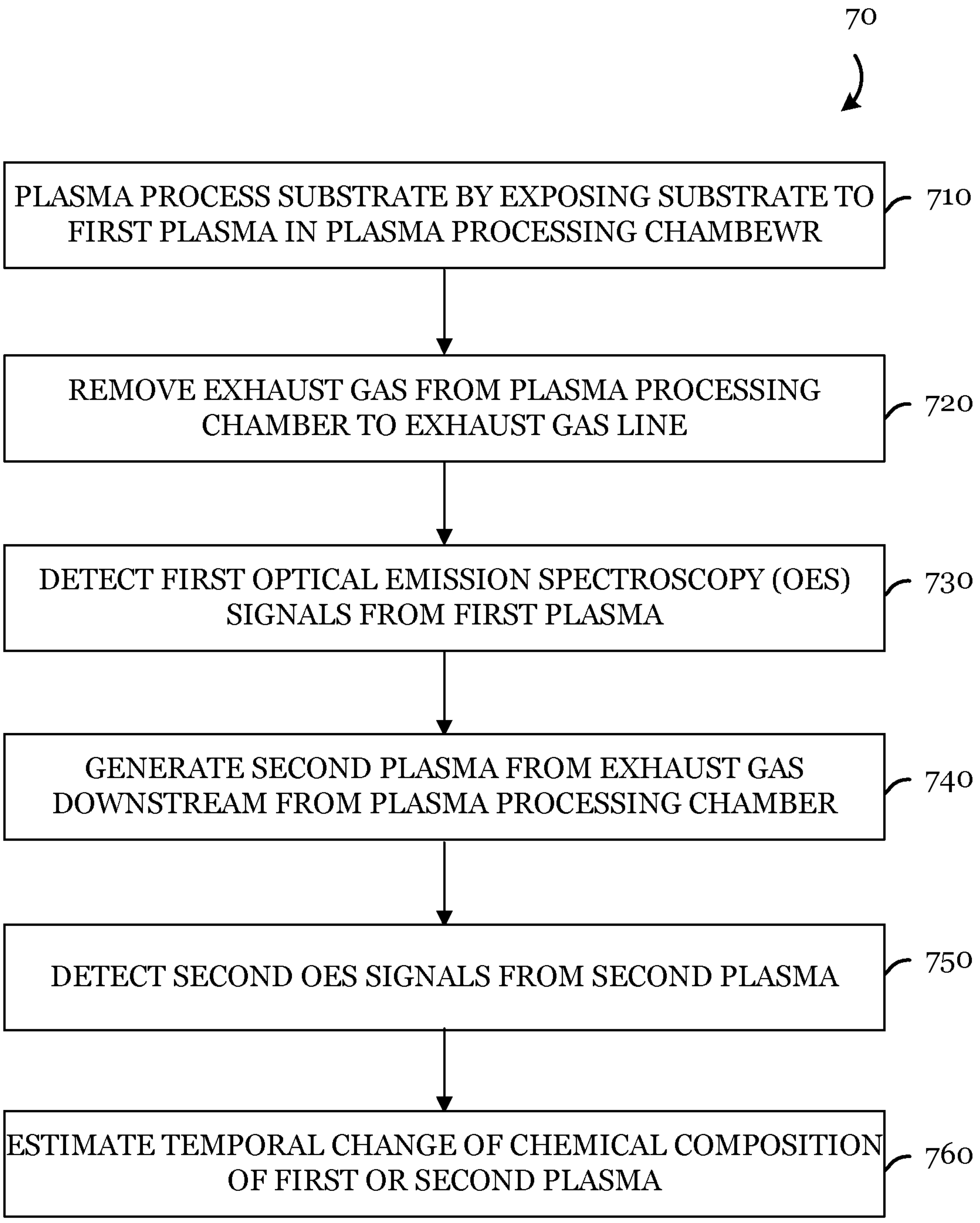
FIG. 7 illustrates an example process flow chart of methods of dual OES data collection in accordance with an embodiment.

FIG. 7 illustrates an example process flow chart of methods of dual OES data collection in accordance with an embodiment.

In FIG. 7, a process flow 70 starts with plasma processing a substrate in a plasma processing chamber by exposing the substrate to a first plasma (block 710). Next, using a vacuum system, an exhaust gas may be removed from the plasma processing chamber to an exhaust line (block 720). First OES signals may then be detected from the first plasma during the plasma processing using an OES measurement assembly connected to the plasma processing chamber (block 730). Subsequently, a second plasma may be generated from the exhaust gas downstream from the plasma processing chamber (block 740), followed by detecting second OES signals from the second plasma during the plasma processing using the OES measurement assembly (block 750). Based on the first or second OES signals, a temporal change of the chemical composition of the first or second plasma may be estimated.

Figure 8:
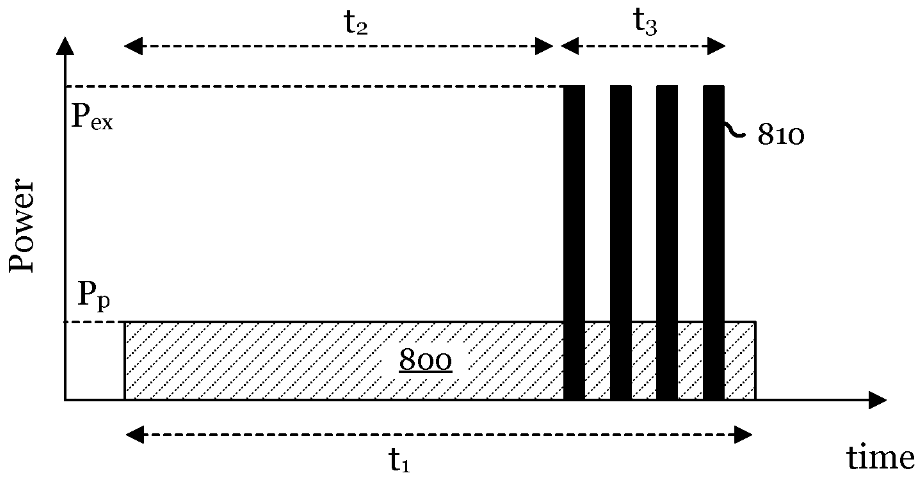
FIG. 8 illustrates an example timing diagram for power pulsing for exhaust OES data collection in accordance with an embodiment.

FIG. 8 illustrates an example timing diagram for power pulsing for exhaust OES data collection during a process in accordance with an embodiment.

As described above, various embodiments of exhaust OES data collection may use a high discharge power for the exhaust plasma for improved OES signal intensity. However, the inventors of this application identified potential issues of shorter hardware lifetime and higher level of contamination due to the high discharge power. These issues may be overcome by a combined use of an adjustable base (pilot) source power and secondary power (e.g., short duty power spikes) during a process of interest. In various embodiments, the exhaust plasma condition may be dynamically controlled by synchronizing the secondary power with exhaust OES data collection. Such embodiments may advantageously optimize the power usage for the exhaust OES for a target process characterization process (e.g., endpoint detection) and thereby extend the hardware lifetime and reduce the contamination.

In FIG. 8, a constant pilot power 800, as a base power may be provided to sustain an exhaust plasma in an exhaust system (e.g., in an exhaust OES chamber) for a time period $t_1$ at a constant power level $P_p$. In various embodiments, the pilot power 800 may be a RF power or a pulsed RF power. In certain embodiments, the time period $t_1$ may cover a total process time of the process (e.g., a plasma etch process). For certain applications such as endpoint detection (EPD), exhaust OES data may only be required near the end of the process. Accordingly, in certain embodiments, the pilot power 800 may be kept relatively low near a minimal power to sustain the exhaust plasma.

Still referring to FIG. 8, a series of power spikes 810, as the secondary power to the exhaust plasma, may be applied after a majority of the expected process time has passed (e.g., after a time period $t_2$). For example, $t_2$ may be between about 10% and 99% of $t_1$ in one embodiment, or between 80% and 99% of $t_1$ in another embodiment. In other words, the series of the power spikes 810 may be provided during a time period $t_3$ as illustrated in FIG. 8, which is substantially shorter than the time period $t_1$ and near the end of the process. In certain embodiments, $t_2$ represents a majority of the plasma process time and may be between 2 sec and 1200 sec. The power level of the power spikes 810 may be selected such that a sufficient level of exhaust OES signal intensity may be obtained.

In various embodiments, each of the power spikes 810 provides power for a short excitation time $\tau_{ex}$, for example, between 0.1 ms and 5 s. In certain embodiments, $\tau_{ex}$ may be between 0.1 ms and 1 s. Short excitation time $\tau_{ex}$ may advantageously extend the hardware lifetime. Further, in one or more embodiments, the excitation time $\tau_{ex}$ may be shorter than the OES time resolution (i.e., time required to perform one OES measurement). In other embodiments, the excitation time $\tau_{ex}$ may be longer than the OES time resolution.

In certain embodiments, a series of power spikes may be applied by a power pulse train having a frequency, for example, in the range of 1 Hz and 10 kHz, for the time period $t_3$. In one or more embodiments, $t_3$ may be a half of $t_2$ or less. In other embodiments, $t_1$ is longer than $t_3$ by a factor of at least 2. This factor, in another embodiment, may be at least 5, or in yet another embodiment, may be at least 10.

OES data collection may be performed in synchronization with the power spikes 810. In various embodiments, the timing of each OES measurement may be synchronized with each of the power spikes 810 with a delay. Having the delay in synchronization may be advantageous in obtaining more stable OES signals at fully excited phase rather than a transitory phase where the excitation process is still in progress. The duration of delay may be determined according to discharge conditions and the power matching unit. In certain embodiments, the delay may be between 10 μs and a few seconds.

Although four spikes are illustrated in FIG. 8, the number of power spikes 810 is not limited to any number. Similarly, the number of OES measurements during one cycle of the OES data collection is not limited to any number, and may or may not be equal to the number of the power spikes 810. For example, the excitation time $\tau_{ex}$ (e.g., >1 s) and the OES time resolution (e.g., <10 ms) may differ by orders of magnitude. In one embodiment, several power spikes with the excitation time $\tau_{ex}$ of a few seconds are used, and more than hundreds of OES measurements may be continuously repeated during the time period $t_3$.

In addition, while the constant power level with constant duty ratio (i.e., constant excitation time $\tau_{ex}$) are illustrated in FIG. 8, various power pulse patterns may be used for OES signal enhancement. The pilot power 800 may also be adjusted with time during the time period $t_1$.

Figure 9:
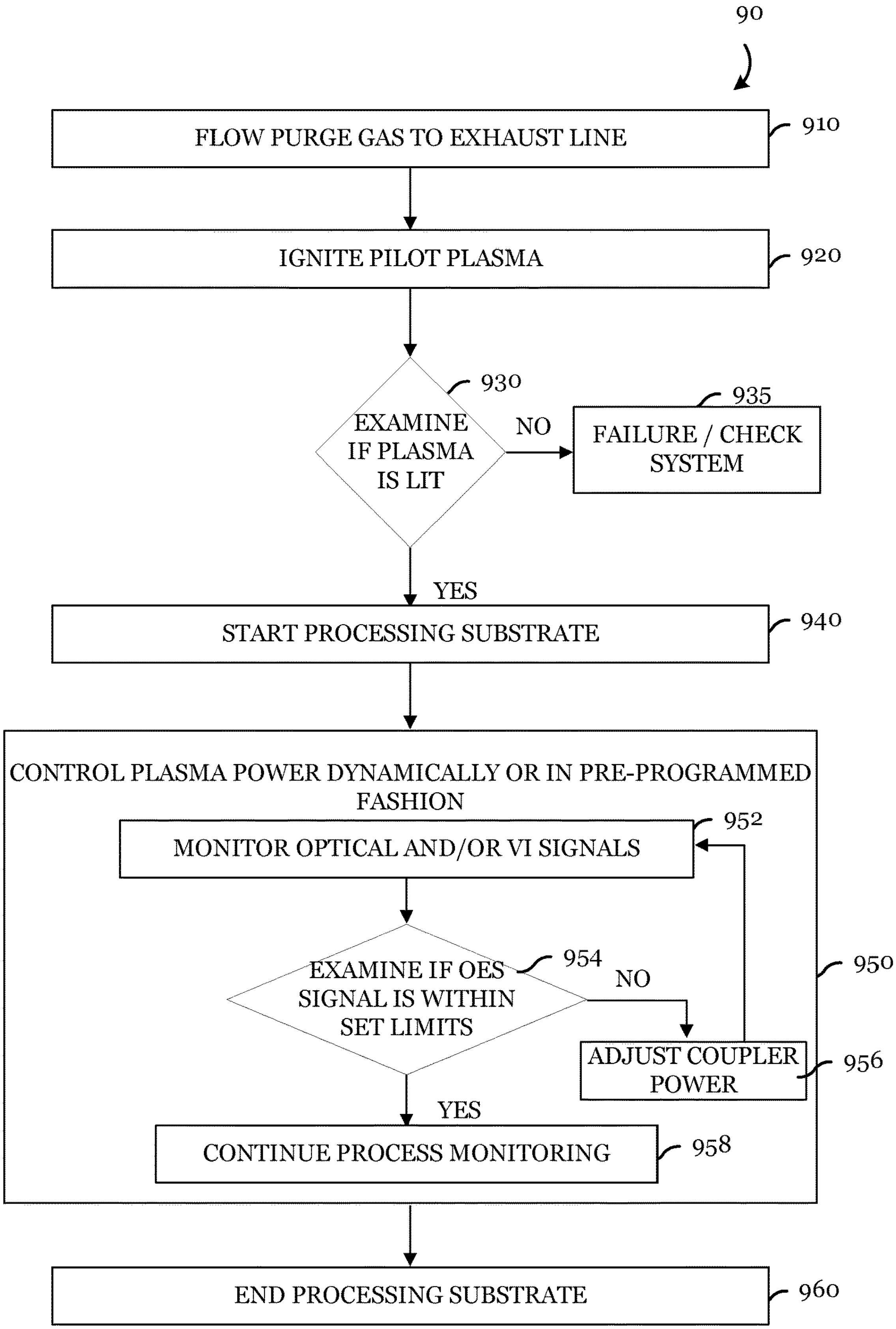
FIG. 9 illustrates an example process flow chart of methods of OES process characterization in accordance with an embodiment.

FIG. 9 illustrates an example process flow chart of methods of OES process characterization in accordance with an embodiment.

In FIG. 9, a process flow 90 starts with a pre-process exhaust plasma ignition prior to processing a substrate. First, a purge gas may be flowed to an exhaust line of a processing system (block 910) and igniting a pilot plasma from the purge gas flowed to the exhaust line (block 920). This may be provided by a pilot power (e.g., the pilot power 800 in FIG. 8). Next, the process flow may proceed to examining if the pilot plasma is lit, for example, in an exhaust OES chamber. In certain embodiments, an OES measurement may be used to confirm the presence of the pilot plasma. If the pilot plasma is not confirmed, the pilot power condition may be examined and updated, or the system may be checked for any mechanical or software failure (block 935). If the pilot plasma is confirmed, the processing of the substrate may be started (block 940). In various embodiments, the processing may comprise a semiconductor device fabrication process such as a plasma etch process and a vapor deposition process. While processing the substrate, the plasma power condition for the exhaust plasma may be controlled dynamically or according to a pre-programmed recipe (block 950). In various embodiments, OES data from the exhaust plasma (exhaust OES) may be measured and monitored during the processing (block 952). In one embodiment, the exhaust OES data collection may be continuously or intermittently performed throughout the processing. Alternately, it may be performed at a selected time window of the processing, for example, near the end of the processing (e.g., during the time period $t_3$ in FIG. 8). Accordingly, controlling the plasma power condition may comprise providing secondary power in form of a series of short duty power spikes to enhance the OES signal intensity. In certain embodiments, the chamber OES data, electrostatic probe data (e.g., V and I) of the exhaust plasma, or both may also be monitored in addition to or in place of the exhaust OES. One or more of these data sets, singly or in combination, may be used for process characterization. Further, while monitoring the exhaust OES, the level of OES signal intensity may be examined (block 954). If the OES signal intensity is shown to be too high or low (e.g., outside of a pre-determined range), the power coupler for the exhaust plasma may be adjusted to decrease or increase the plasma source power (block 956) until the OES signal intensity falls within the pre-determined range. While dynamically controlling the plasma power condition for the exhaust plasma, the OES-based process monitoring may be continued (block 958) until the end of the processing (block 960).

In various embodiments of OES process characterization, OES data collection may be repeated as a cyclic process, alternating the chamber and exhaust OES. For example, the OES signal source (i.e., the chamber or exhaust OES) may be switched every 10 ms. The collected data may be analyzed separately to evaluate the confidence level individually. Alternately, a user may manually switch the OES signal source depending on the type of process and monitoring.

Figure 10:
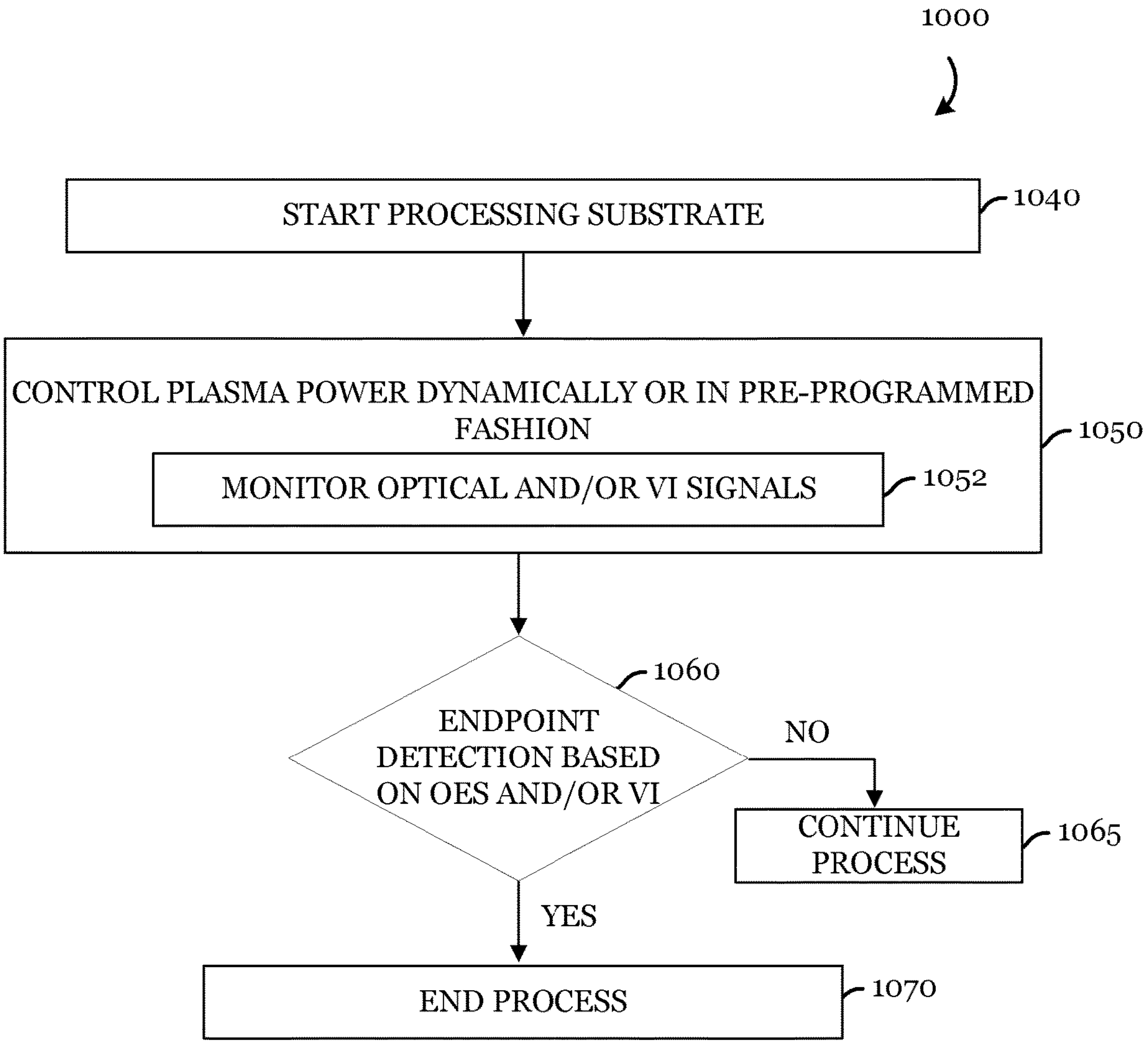
FIG. 10 illustrates an example process flow chart of methods of OES process endpoint detection (EPD) in accordance with an embodiment.

FIG. 10 illustrates an example process flow chart of methods of OES process endpoint detection (EPD) in accordance with an embodiment.

In FIG. 10, a process flow 1000 starts with processing a substrate. In certain embodiments, prior to the processing of the substrate, a pre-process pilot plasma ignition may optionally be performed as described referring to FIG. 9. Similar to the prior embodiment (FIG. 9), while processing the substrate, the plasma power condition for the exhaust plasma may be controlled dynamically or according to a pre-programmed recipe (block 1050). In various embodiments, the exhaust OES data, the chamber OES data, electrostatic probe data (e.g., V and I) of the exhaust plasma, or any combination thereof may be monitored (block 1052). The dynamic plasma power control may comprise constantly examining the level of exhaust OES signal intensity for an appropriate range as described above referring to FIG. 8. For particular applications in EPD, in certain embodiments, exhaust OES data collection may be performed only near the end of the processing and the usage of the OES measurement assembly may advantageously be minimized. The EPD may be performed based on the exhaust OES data, the chamber OES data, electrostatic probe data (e.g., V and I) of the exhaust plasma, or any combination thereof (block 1060). A program having an algorithm may be used to determine an endpoint of the process, where it may instruct the control unit of the processing system to continue the processing (block 1065) until the endpoint is detected. Once the endpoint is detected, the program may instruct the control unit to end the processing of the substrate (block 1070).

Various algorithms may be designed depending on criteria used for determining the process endpoint. In one embodiment, the algorithm may determine an initial endpoint based on the exhaust OES data and the chamber OES or the electrostatic probe data may be used to confirm or update the initial endpoint to output a final endpoint. The algorithm may also detect an EPD failure in the event of unsuccessful data collection.

In another embodiment, the algorithm may first examine the level of chamber OES signal and decide if it is sufficient to perform EPD singly based on the chamber OES. If the chamber OES signal is strong enough, EPD may be performed using the chamber OES and may bypass the steps of generating and analyzing the exhaust plasma. Only when the chamber OES is determined to be too weak for EPD, the exhaust plasma may be generated and EPD may be performed using the exhaust OES with or without including electrostatic probe data.

Figure 11A:
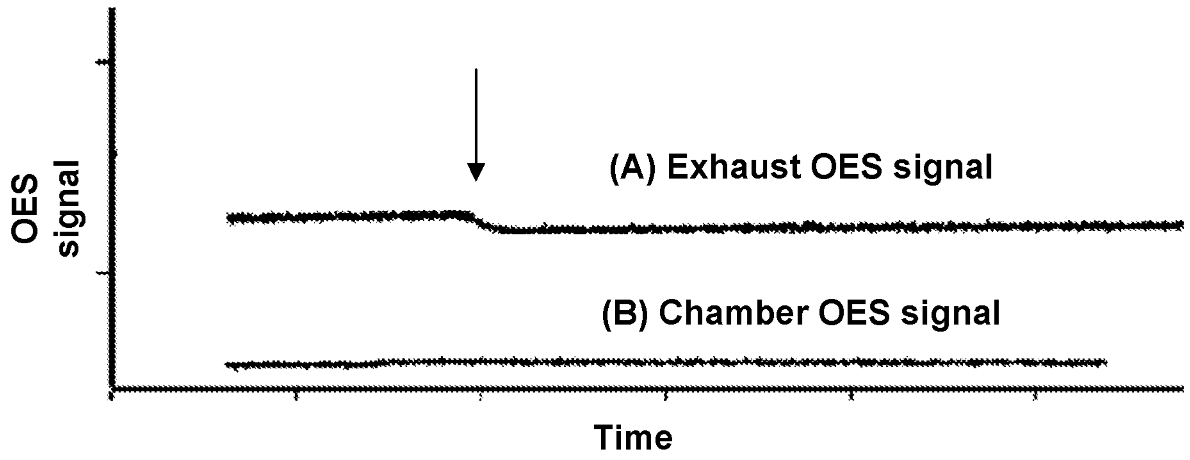
Figure 11B:
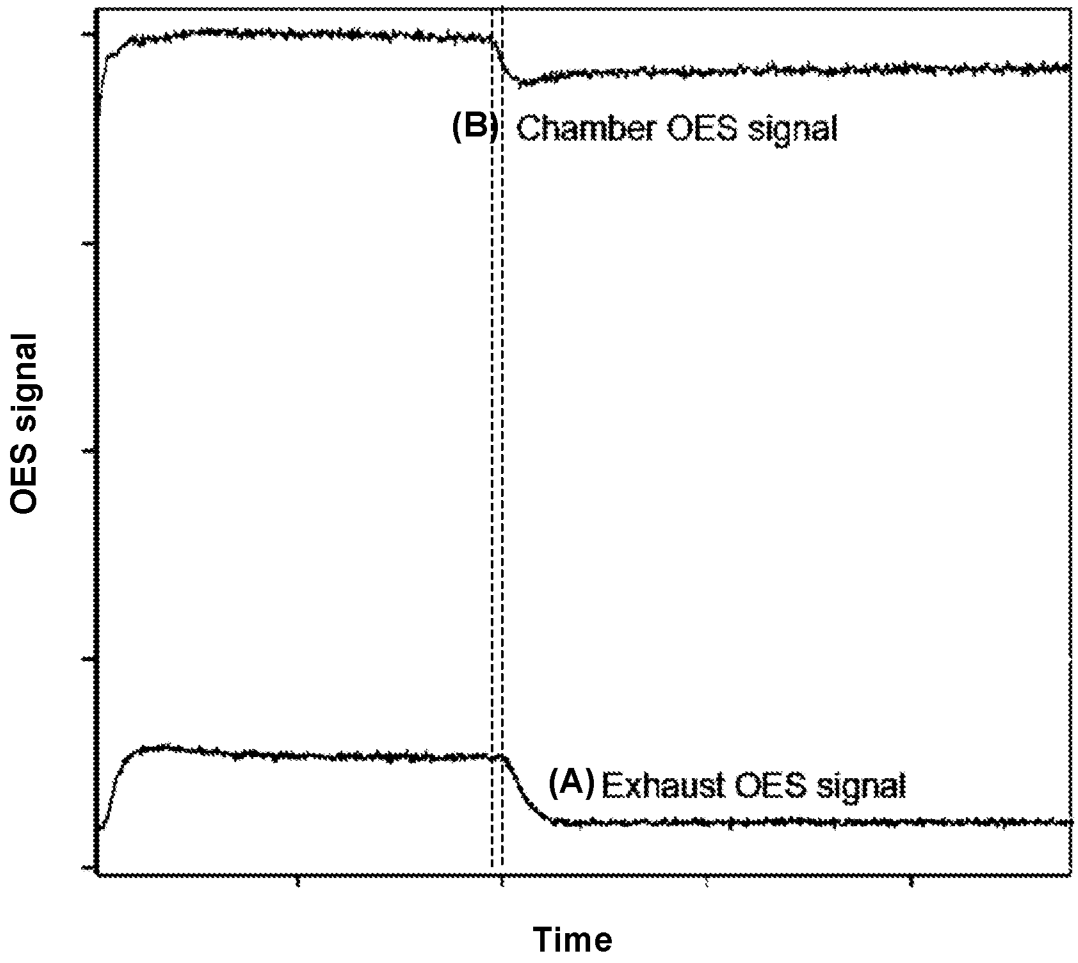

FIGS. 11A-11B illustrate experimental data of example OES endpoint detection (EPD).

The inventors of this application demonstrated through experiments the utility of the exhaust OES in accordance with various embodiments. In one example, a plasma etch process was performed to etch an organic layer formed over a substrate, and OES data from both the processing chamber and the exhaust line were monitored for endpoint detection (EPD). First, FIG. 11A illustrates time evolution of (A) exhaust and (B) chamber OES signals at the wavelength of 483 nm (representing CO species in plasma). Both OES signals were measured from the process with a relatively weak source power of 100 W. In FIG. 11A, because of this relatively weak plasma power condition for the processing chamber, the intensity of chamber OES signals is low throughout the plotted process time duration and an endpoint cannot be clearly identified from the data. On the other hand, the exhaust OES signals are much stronger and an endpoint can be identified as indicated by an arrow in FIG. 11A. This result proves that EPD is possible based on the exhaust OES. It should be noted that the intensity of exhaust OES signals is inherently independent of the plasma power condition for the processing chamber because it is from a separate (remote) plasma formed in a separate chamber or directly in the exhaust line.

Further, FIG. 11B illustrates time evolution of exhaust and chamber OES signals from the organic removal process at another process condition where a higher plasma power was used for the process compared to the case in FIG. 11A. With increasing the plasma power for the process, the OES signals are improved substantially, and an endpoint of the process can be identified from the chamber OES signals. The exhaust OES signals are also sufficiently strong for EPD. As indicated by two dotted lines in FIG. 11B, the difference between the two estimated endpoints of the process is small (<1 sec), which is acceptable for the majority of EPD applications.

Example embodiments of the invention are described below. Other embodiments can also be understood from the entirety of the specification as well as the claims filed herein.

Example 1. A processing system that includes: a processing chamber configured to hold a substrate to be processed;

a first vacuum pump; a second vacuum pump disposed downstream from the first vacuum pump; an exhaust gas line connecting the process chamber and the first vacuum pump, and the first vacuum pump and the second vacuum pump; a plasma power supply including a first RF power source configured to generate a plasma from a portion of an exhaust gas between the first and second vacuum pumps; and an optical emission spectroscopy (OES) measurement assembly including an OES detector configured to measure OES signals from the plasma.

Example 2. The processing system of example 1 further including a second RF power source configured to generate a processing plasma in the processing chamber, where the OES measurement assembly is further configured to measure OES signals from the processing plasma.

Example 3. The processing system of one of examples 1 or 2, further including a remote plasma chamber connected to the exhaust gas line and the first RF power source, the plasma being generated in the remote plasma chamber.

Example 4. The processing system of one of examples 1 to 3, where the OES measurement assembly includes an optical switch configured to select one of the OES signals from the plasma and the processing plasma and transmit the selected OES signals to the OES detector.

Example 5. The processing system of one of examples 1 to 4, where the optical switch is further configured to combine the OES signals from the plasma and the processing plasma and transmit the combined OES signals to the OES detector.

Example 6. The processing system of one of examples 1 to 5, the plasma power supply includes a plasma power coupler.

Example 7. The processing system of one of examples 1 to 6, where the plasma power supply includes a coil that surrounds a portion of the exhaust line and is configured to generate the plasma in the portion of the exhaust line.

Example 8. The processing system of one of examples 1 to 7, further including a RF sensor configured to detect electrical parameters of the plasma.

Example 9. A plasma processing system that includes: a plasma processing chamber configured to hold a substrate to be processed; a RF power source configured to generate a first plasma in the plasma processing chamber; a first vacuum pump; an exhaust gas line connecting the plasma process chamber and the first vacuum pump; a plasma power supply configured to generate a second plasma from a portion of an exhaust gas downstream from the plasma processing chamber, and an optical emission spectroscopy (OES) measurement assembly including: an OES detector configured to measure first OES signals from the first plasma and second OES signals from the second plasma; a microprocessor, and a non-transitory memory storing a program to be executed in the microprocessor, the program including instructions to: perform a plasma process on a substrate; during the process, record the first or second OES signals associated with a chemical composition of the first or second plasma, and based on the first or second OES signals, estimate a temporal change of the chemical composition to evaluate a progress of the process.

Example 10. The plasma processing system of example 9, where the portion of the exhaust gas is downstream from the first pump.

Example 11. The plasma processing system of one of examples 9 or 10, further including a remote plasma chamber connected to the exhaust line via a gas inlet, the second plasma being generated in the remote plasma chamber.

Example 12. The plasma processing system of one of examples 9 to 11, where the OES measurement assembly includes an optical switch configured to select one of the first and second OES signals and transmit the selected OES signal to the OES detector.

Example 13. The plasma processing system of one of examples 9 to 12, where the program further includes an instruction to perform an endpoint detection of the process based on the first or second OES signals.

Example 14. A method of processing a substrate that includes: plasma processing a substrate in a plasma processing chamber by exposing the substrate to a first plasma; using a vacuum system, remove an exhaust gas from the plasma processing chamber to an exhaust line; using an optical emission spectroscopy (OES) measurement assembly connected to the plasma processing chamber, detecting first OES signals from the first plasma during the plasma processing, the first OES signals being associated with a chemical composition of the first plasma; generating a second plasma from the exhaust gas downstream from the plasma processing chamber; using the OES measurement assembly, detecting second OES signals from the second plasma during the plasma processing, the second OES signals being associated with a chemical composition of the second plasma; and based on the first or second OES signals, estimating a temporal change of the chemical composition of the first or second plasma.

Example 15. The method of example 14, further including performing an endpoint detection (EPD) process based on the estimated temporal change of the chemical composition of the first or second plasma.

Example 16. The method of one of examples 14 or 15, where generating the second plasma includes applying a base source power and a series of power spikes to an electrode or coil connected to the vacuum system, the series of power spikes being correlated with a timing of detecting the second OES signals.

Example 17. The method of one of examples 14 to 16, further including switching between detecting first and second OES signals by using an optical switch of the OES measurement assembly.

Example 18. The method of one of examples 14 to 17, further including: comparing signal intensities of the first and second OES signals; and selecting first or second OES signals with a higher signal intensity than the other, where estimating the temporal change of the chemical composition is based on the selected OES signal.

Example 19. The method of one of examples 14 to 18, further including: measuring electrical parameters of the second plasma; and performing an endpoint detection (EPD) process based on the measured electrical parameters.

Example 20. The method of one of examples 14 to 19, further including performing first and second endpoint detection (EPD) processes, the first EPD process being based on the first or second OES signals, the second EPD process being based on measured electrical parameters of the second plasma.

Example 21. The method of one of examples 14 to 20, where the vacuum system includes a vacuum pump, and where the second plasma is generated from the exhaust gas downstream from the vacuum pump.

Example 22. The processing system of one of examples 1 to 8, further including an optical fiber cable that transmit the OES signals from the plasma to the OES measurement assembly.

Example 23. The plasma processing system of one of examples 9 to 13, further including a first optical fiber cable that transmits the first OES signals from the plasma processing chamber to the OES measurement assembly and a second optical fiber cable that transmits the second OES signals from the portion of the exhaust gas to the OES measurement assembly.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A processing system comprising:

a processing chamber configured to hold a substrate to be processed;

a first vacuum pump;

a second vacuum pump disposed downstream from the first vacuum pump;

an exhaust gas line connecting the processing chamber and the first vacuum pump, and the first vacuum pump and the second vacuum pump;

a plasma power supply comprising a first RF power source configured to generate a plasma from a portion of an exhaust gas between the first and second vacuum pumps; and an optical emission spectroscopy (OES) measurement assembly comprising:

an OES detector configured to measure OES signals from the plasma; and a control unit configured to control the first RF power source to apply a base source power to sustain the plasma and to apply a series of power spikes to the plasma, the series of power spikes synchronized with detection of the OES signals by the OES detector.

2. The processing system of claim 1, further comprising a second RF power source configured to generate a processing plasma in the processing chamber, wherein the OES measurement assembly is further configured to measure OES signals from the processing plasma.

3. The processing system of claim 1, further comprising a remote plasma chamber connected to the exhaust gas line and the first RF power source, the plasma being generated in the remote plasma chamber.

4. The processing system of claim 2, wherein the OES measurement assembly comprises an optical switch configured to select one of the OES signals from the plasma and the processing plasma and transmit the selected OES signal to the OES detector.

5. The processing system of claim 4, wherein the optical switch is further configured to combine the OES signals from the plasma and the processing plasma and transmit the combined OES signals to the OES detector.

6. The processing system of claim 1, wherein the plasma power supply comprises a plasma power coupler.

7. The processing system of claim 1, wherein the plasma power supply comprises a coil that surrounds a portion of the exhaust gas line and is configured to generate the plasma in the portion of the exhaust gas line.

8. The processing system of claim 1, further comprising an RF sensor configured to detect electrical parameters of the plasma.

9. A plasma processing system comprising:

a plasma processing chamber configured to hold a substrate to be processed;

an RF power source configured to generate a first plasma in the plasma processing chamber;

a first vacuum pump;

an exhaust gas line connecting the plasma processing chamber and the first vacuum pump;

a plasma power supply configured to generate a second plasma from a portion of an exhaust gas downstream from the plasma processing chamber; and an optical emission spectroscopy (OES) measurement assembly comprising:

an OES detector configured to measure first OES signals from the first plasma and second OES signals from the second plasma;

a microprocessor; and a non-transitory memory storing a program to be executed in the microprocessor, the program comprising instructions to:

perform a plasma process on the substrate;

control the plasma power supply to apply a base source power to sustain the second plasma and to apply a series of power spikes to the second plasma, the series of power spikes synchronized with detection of the second OES signals by the OES detector;

during the plasma process, record the first OES signals or the second OES signals associated with a chemical composition of the first plasma or the second plasma; and based on the first OES signals or the second OES signals, estimate a temporal change of the chemical composition to evaluate a progress of the plasma process.

10. The plasma processing system of claim 9, wherein the portion of the exhaust gas is downstream from the first vacuum pump.

11. The plasma processing system of claim 9, further comprising a remote plasma chamber connected to the exhaust gas line via a gas inlet, the second plasma being generated in the remote plasma chamber.

12. The plasma processing system of claim 9, wherein the OES measurement assembly comprises an optical switch configured to select one of the first and second OES signals and transmit the selected OES signal to the OES detector.

13. The plasma processing system of claim 9, wherein the program further comprises an instruction to perform an endpoint detection of the plasma process based on the first or second OES signals.

14. A processing system comprising:

a plasma processing chamber configured to hold a substrate to be processed;

an RF power source;

a first vacuum pump;

an exhaust gas line connecting the plasma processing chamber and the first vacuum pump;

an exhaust OES chamber connected to the exhaust gas line;

a plasma power supply coupled to the exhaust OES chamber;

an optical emission spectroscopy (OES) detector;

a microprocessor; and a non-transitory memory storing a program to be executed in the microprocessor, the program comprising instructions to:

control the plasma power supply to:

apply a base source power to an electrode or coil connected to the exhaust OES chamber to generate an exhaust plasma in the exhaust OES chamber; and after generating the exhaust plasma, apply a series of power spikes to the electrode or coil;

measure exhaust OES signals from the exhaust plasma, wherein a timing of detecting the exhaust OES signals is correlated with the series of power spikes;

measure electrical parameters of the exhaust plasma; and perform an endpoint detection (EPD) process based on the measured electrical parameters and the exhaust OES signals.

15. The processing system of claim 14, wherein the program comprises further instructions to:

detect process OES signals from a process plasma powered by the RF power source in the plasma processing chamber; and based on the process OES signals, estimate a temporal change of a chemical composition of the process plasma.

16. The processing system of claim 15, further comprising an optical switch, wherein the microprocessor enables the optical switch to select between the process OES signals and the exhaust OES signals, the selected OES signals being transmitted to the OES detector.

17. The processing system of claim 1, wherein the control unit is further configured to monitor an intensity of the OES signals and, based on the monitored intensity being outside a predetermined range, to adjust a power level of the first RF power source.

18. The plasma processing system of claim 9, further comprising:

a first optical fiber cable configured to transmit the first OES signals from the first plasma to the OES measurement assembly; and a second optical fiber cable configured to transmit the second OES signals from the second plasma to the OES measurement assembly.

19. The plasma processing system of claim 9, wherein the program further comprises instructions to apply the series of power spikes after a majority of a total process time of the plasma process has elapsed.

20. The processing system of claim 14, wherein the exhaust OES signals are detected with a delay relative to each of the power spikes.

* * * * *